United States Patent [19]

Favreau et al.

[11] Patent Number: 5,022,958
[45] Date of Patent: Jun. 11, 1991

[54] METHOD OF ETCHING FOR INTEGRATED CIRCUITS WITH PLANARIZED DIELECTRIC

[75] Inventors: David P. Favreau, Coopersburg; Jane A. Swiderski, Kunkletown; Daniel J. Vitkavage, Zionsville, all of Pa.

[73] Assignee: AT&T Bell Laboratories, Murray Hill, N.J.

[21] Appl. No.: 544,705

[22] Filed: Jun. 27, 1990

[51] Int. Cl.$^5$ .................. B44C 1/22; C03C 15/00; C03C 25/06
[52] U.S. Cl. ............................. 156/643; 156/644; 156/646; 156/651; 156/652; 156/657; 156/659.1; 437/40; 437/59; 437/200; 437/228
[58] Field of Search ............... 156/643, 644, 646, 651, 156/652, 653, 657, 659.1, 662; 204/192.32, 192.37; 427/38, 39; 437/40, 41, 59, 200, 228

[56] References Cited

U.S. PATENT DOCUMENTS

| 4,532,002 | 7/1985 | White | 156/652 X |
| 4,816,115 | 3/1989 | Horner et al. | 156/651 X |
| 4,832,789 | 5/1989 | Cochran et al. | 156/644 |
| 4,939,105 | 7/1990 | Langley | 156/644 X |
| 4,956,313 | 9/1990 | Cote et al. | 156/636 |
| 4,966,865 | 10/1990 | Welch et al. | 156/644 X |

Primary Examiner—William A. Powell
Attorney, Agent, or Firm—J. T. Rehberg

[57] ABSTRACT

An integrated circuit design and method for its fabrication are disclosed. A bilevel-dielectric is formed to cover the active regions of a transistor and raised topographic features such as a gate runner. The upper level of the dielectric is planarized to provide for easier subsequent multilevel-conductor processing. Windows are opened in the bilayer dielectric by etching through the upper level of the dielectric, stopping on the lower level of the dielectric. Then the etch procedure is continued to etch through the lower level of the dielectric.

8 Claims, 2 Drawing Sheets

METHOD OF ETCHING FOR INTEGRATED CIRCUITS WITH PLANARIZED DIELECTRIC

TECHNICAL FIELD

The present invention relates to integrated circuits in general, and more particularly to integrated circuits having planarized dielectrics and methods for their fabrication.

BACKGROUND OF THE INVENTION

In the production of integrated circuits, it is often necessary to form openings, termed "windows" (also termed "contacts" or "vias") in one or more dielectric layers so that electrical contact may be made to underlying regions or conductors. After a window is opened, a conductive material is deposited within the window. Conductive material may also be deposited over the dielectric. The conductive layer is then lithographically patterned to form electrical conductors, often termed "runners." As integrated circuit dimensions have shrunk to below about 1 μm, it has become increasingly common to planarize the dielectric layer prior to forming the windows. The planarization process yields a flatter dielectric surface for subsequent lithographic operations which may be performed to pattern the dielectric or the subsequently-formed conductive layers. In other words, a planar surface reduces the depth of field requirements for the optical system used to expose the resist layer that defines the pattern. In addition, planarization of the first dielectric layer (i.e., the one adjacent the gate and source/drain regions) facilitates the patterning of subsequent dielectric and conductive layers in so-called multi-level metal processes.

Various techniques have been developed to planarize dielectric layers. One technique, referred to as a "resist etchback," involves depositing a resist material on the surface to be planarized. Since the resist is a liquid, its top surface assumes a flat profile regardless of underlying irregularities. A plasma etch (e.g., reactive ion etch) of the hardened resist and the underlying dielectric causes the flat surface of the resist to be transferred into the underlying dielectric since the etch rate of the resist is chosen to be similar to that of the dielectric. In another technique, a mechanical wafer polisher is used to planarize the surface of the dielectric.

Unfortunately, planarization, though desirable for the reasons mentioned above, presents certain problems in subsequent processing. After a dielectric layer has been planarized, it is necessary, as mentioned before, to open windows by etching the dielectric. Since the thickness of the planarized dielectric varies with respect to the underlying topographic features, the window etching procedure may overetch and damage certain of these underlying topographic features. For example, in a typical FET window etching process, gate runners which extend over field oxides may be damaged by etching processes which are designed to open windows to source and drain regions as well as gate runners.

SUMMARY OF THE INVENTION

An illustrative embodiment of the present invention provides a method of fabricating an integrated circuit including steps of:
forming a raised topographic feature upon a substrate;
forming a first dielectric layer covering the raised topographic feature;
forming a second dielectric layer covering the first dielectric layer;
planarizing the second dielectric layer;
selectively etching the second dielectric layer to create at least two openings, the first opening being above the topographic feature and the second opening being above the substrate, the etching process stopping in the second opening in the vicinity of the first dielectric; and then
etching said first dielectric to extend the second opening to the substrate.

Illustratively, the etching process employed to etch the planarized second dielectric exhibits good selectivity against etching the first dielectric. Consequently, openings of various depths may be created without substantial damage to the first dielectric or to raised features which underlie the first dielectric, such as gate runners or higher level runners (which may be silicided). Thus, the invention helps to prevent removal of all of the silicide over gate runners.

DETAILED DESCRIPTION

The present invention provides an integrated circuit with a planarized dielectric which may be etched without fear of severely damaging underlying structures. In an illustrative embodiment, the dielectric is a bi-layer dielectric. The lower or first dielectric layer covers the integrated circuit with a uniform thickness. The upper or second dielectric covers the first dielectric. The upper or second dielectric is planarized. Then the upper or second dielectric is etched with an etching procedure which exhibits good selectivity against the first dielectric layer. The first dielectric serves to provide a useful resource of protection to the underlying structures. Consequently, openings of various depths may be created in the second dielectric layer without significantly damaging or overetching the underlying structures beneath the lower or first dielectric. After the second dielectric layer has been etched in all desired locations, a different etching procedure is used to etch the first dielectric layer (which has a fairly uniform thickness).

Figure 1:
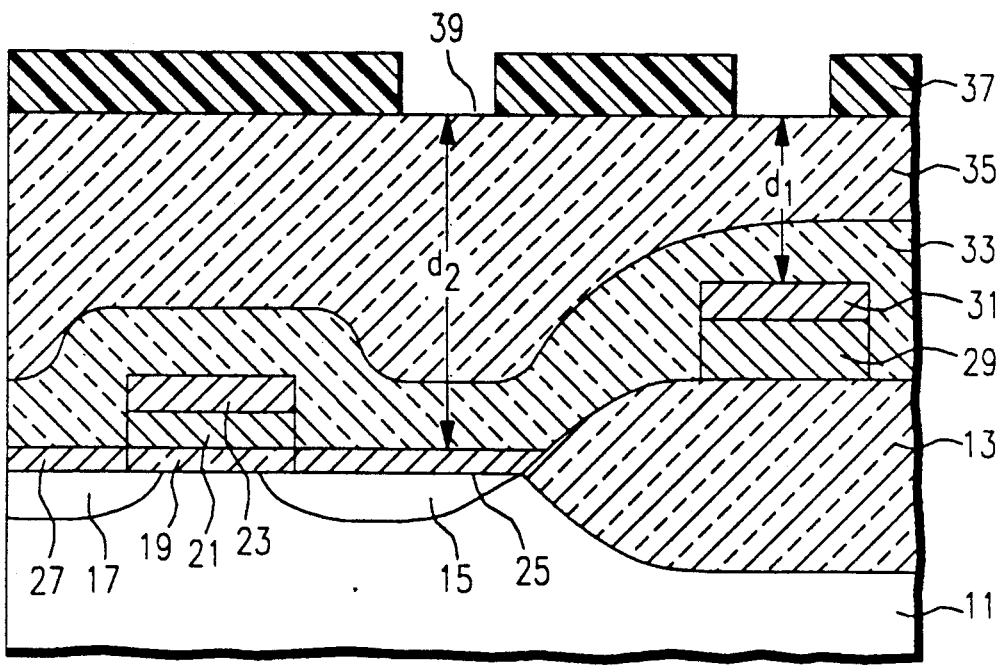
FIGS. 1-3 are cross-sectional views which schematically show an illustrative embodiment of the present invention.

Referring to FIG. 1, a section of a MOS circuit formed in a substrate is illustrated. Substrate 11 may be silicon or an epitaxial layer of silicon formed on silicon or other materials. For example, reference numeral 11 may also denote a doped tub region. MOSFET gate oxide 19 is covered by conductor 21 which may be, typically, polysilicon. Conductor 21 may be covered, if desired, by a silicide layer 23 which may be titanium silicide or another refractory metal silicide. Junctions 15 and 17 may be covered with silicides 25 and 27, respectively, if desired. Field oxide 13 serves to separate adjacent transistors. A gate runner including conductor 29 and silicide 21 is formed atop field oxide 13 (note that gate runner 29, 31 runs essentially perpendicular to the plane of the figure and may comprise an extension of the gate structure of another transistor located outside the plane of the figure). Although gate spacers have not been illustrated in the figure and lightly-doped-drain (LDD) junctions have not been shown either, such structures may be included if desired. Dielectric layer 33 covers the illustrated transistor and gate runner. Dielectric layer 33 is a generally conformal layer typically of silicon dioxide. Layer 33 may be deposited by the decomposition by heating of tetraethoxysilane (TEOS) gas. Other organometallic precursors known to those skilled in the art may also be used. In an illustrative embodiment, layer 33 may be formed from TEOS to a thickness of approximately 200 nm. The thickness is not critical to the practice of this invention and a wide range of thicknesses may be employed. Illustratively, a range of 180–220 nm may be employed.

Dielectric layer 35 covers dielectric layer 33. In an illustrative embodiment, dielectric layer 35 may be formed from TEOS, including approximately $4 \pm \frac{1}{2}\%$ each of phosphorous and boron by weight. A variety of other precursor gases are known in the art for producing dielectrics 33 and 35 in either a doped or undoped state to any desired thickness. Typically, in applicants' investigations the thickness of layer 35 may be approximately 12,000 Å ± 1000 Å before planarization.

Layer 35 is planarized. Typically, layer 35 may be planarized by the aforementioned photoresist-etchback technique, or by reactive ion etching, or by mechanical planarization or some combination of these methods. Then patterned resist material 37 is formed upon the upper surface 39 of dielectric layer 35.

It is desired to create openings through dielectrics 35 and 33 to silicides 31 and 25. (If silicides 31 and 25 are not employed, it will be assumed that it is, nevertheless, desired to create openings to conductors 29 and junction 15.) It will be noted that the distance, $d_1$, between upper surface 39 of dielectric 35 and silicide 31 is less than the distance, $d_2$, between upper surface 39 of dielectric 35 and silicide 25. It is desired to create openings to silicides 31 and 25 without risking significant damage to silicide 31 as the etching procedure continues to "dig" downward toward silicide 35. In many applications, what constitutes "significant" damage is functionally defined as the continued ability of the silicide to serve as an acceptably low resistance conductor.

Figure 2:
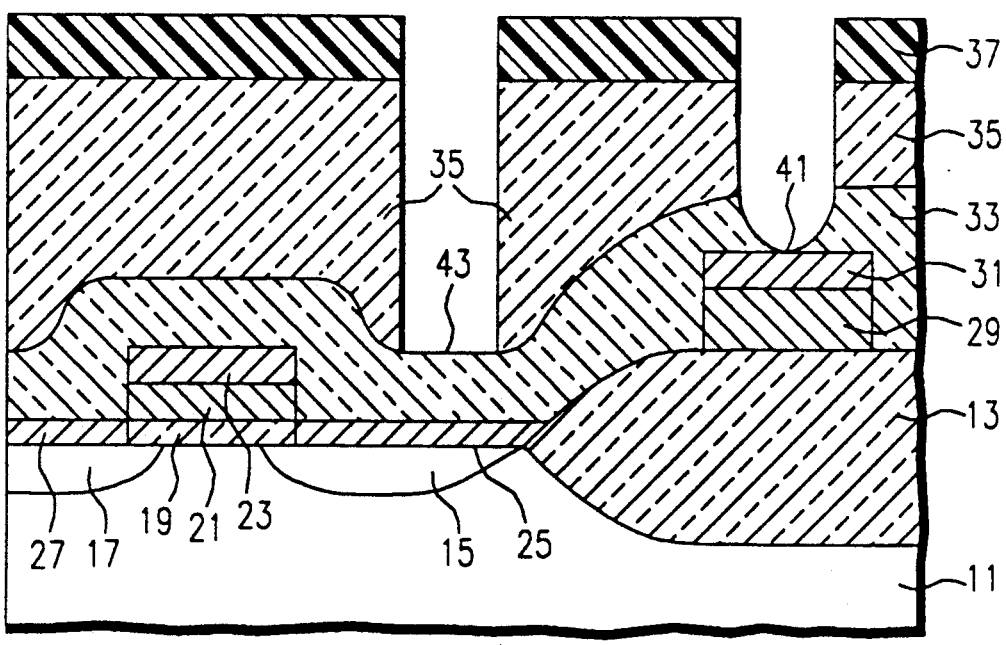
Figure 3:
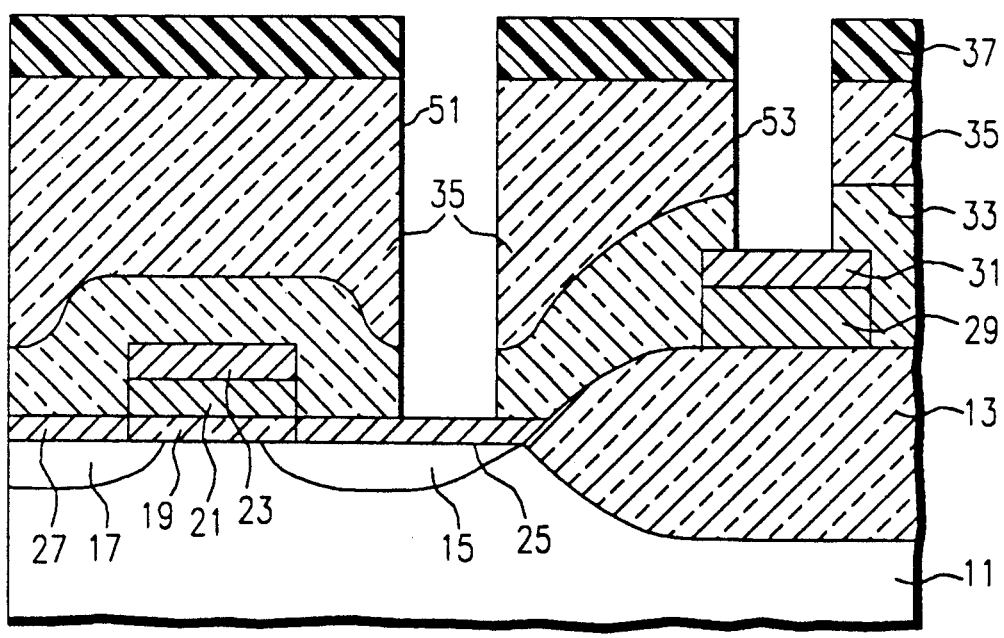

The present invention provides a solution to the aforementioned dilemma as illustrated in FIGS. 2 and 3.

Turning to FIG. 2, it will be noted that dielectric 35 has been etched by an etching procedure which exhibits satisfactory selectivity against dielectric layer 33. In particular, it will be noted that the etching procedure may create some damage to upper surface 41 of dielectric 33 located above gate runner 29, 31. Some amount of penetration into layer 33 (and even into silicide 31) may be observed and tolerated. In the meantime, the etching procedure has etched downward through a considerably greater thickness of dielectric 35 towards silicide 25, stopping approximately at upper surface 43 of dielectric 33.

Turning now to FIG. 3, there is illustrated the structure of FIG. 2 after the etching process is completed. After dielectric 35 has been etched downward exposing dielectric 33, then dielectric 33 is etched downward completely exposing silicides 31 and 25. Ideally, etching of dielectric 33 may be accomplished without significantly damaging silicides 31 or 25 because the initial thickness of dielectric 33 is comparatively uniform over silicides 31 and 25.

After openings 51 and 53 have been created, they may be filled with conductive material and subsequent integrated circuit processing may continue.

In an illustrative embodiment, as mentioned before, regions 25 and 31 are titanium silicide; dielectric 33 is TEOS, and dielectric 35 is BPTEOS. Applicants have found that an etch procedure for dielectric 35 which is satisfactorily selective against dielectric 33 may be performed in an AME 5000 machine (manufactured by Applied Materials, Inc., Santa Clara, CA) using 30 sccm of $CHF_3$ and 60 sccm of Ar, (optionally a small amount of $CF_4$ up to 3 sccm may also be used) at a power of 625 watts, pressure of 85 milliTorr and magnetic field of 60 Gauss. It is hypothesized that one of the reasons why the etch is selective is because it relies upon a polymeric accumulation upon surfaces 41 and 43. The polymer probably contains carbon, hydrogen and flourine originating from the $CHF_3$. After the etch procedure creates the configuration schematically depicted in FIG. 2, a contact descum procedure in pure oxygen at a flow rate of 50 sccm at 20 mTorr for 7 seconds is performed to remove the polymer which has accumulated upon surfaces 41 and 43. Then a final etch procedure is performed to create the configuration of FIG. 3 by etching through dielectric 33. The final etch procedure includes: 30 sccm of $CHF_3$, 60 sccm of Ar, and 8–12 sccm (preferably 9 sccm) of $CF_4$, at the same power, pressure, and magnetic field as before. In the illustrative embodiment just discussed, the procedure has worked well for opening 0.7 μm diameter and larger windows.

In general terms, applicants have found that the addition of $CF_4$ tends to enhance etch rates and reduce selectivity. It is hypothesized that fluorine gas is a by-product of $CF_4$ breakdown in the etch plasma. The fluorine may attack the polymer mentioned above, thus enhancing etch rate and reducing the apparent selectivity created by the polymer.

The inventive procedure may be employed at upper levels of an integrated circuit also. For example, if it is desired to make contacts to runners or other elevated topographic features while simultaneously making contact to a less elevated region or structure this invention may be employed.

Applicants have found, incidentally, that etch selectivity (at least for submicron windows) apparently depends somewhat upon aspect ratio, as well as the etch chemistry, and that, as aspect ratio increases (at least in the submicron regime), selectivity also increases. The following example illustrates the effects of aspect ratio.

Referring to FIG. 1, layer 33 may be TEOS with a thickness of 200 nm. Thickness $d_1$ may be 650 nm (i.e., 450 nm BPTEOS over 200 nm TEOS). Thickness $d_2$ may be 1100 nm (i.e., 900 nm BPTEOS over 200 nm TEOS). If an etch recipe employing significant amounts of $CF_4$ (for example, 9 sccm or so) together with $CHF_3$ and Argon, were employed at the outset (contrary to applicants' present teaching), the observed selectivity of the etch process for BPTEOS against TEOS would be 1.3 or 1.5 to 1 for both $d_1$ and $d_2$ windows. The selectivity of this recipe for TEOS against $TiSi_2$ is approximately 10 to 1.

If the $CF_4$ is dramatically reduced or eliminated, then the selectivity of the etch recipe for TEOS against $TiSi_2$ increases to nearly 25 to 1. Concurrently, the selectivity of the etch recipe for BPTEOS against TEOS is observed to depend upon aspect ratio. For thickness $d_1$ the selectivity is nearly 2 to 1. For thickness $d_2$ the selectivity increases to nearly 10 to 1.

Thus, the inventive etch process employs a two-step procedure in which an etching recipe without substantial amounts of $CF_4$ is employed first. This first step exhibits great selectivity for BPTEOS against TEOS over the source/drain region (i.e., thickness $d_2$) and at least acceptable selectivity over the gate runner (i.e., thickness $d_1$). In practice, the first etch step is sometimes observed to penetrate the TEOS and even etch silicide 31. Typical silicide 31 thicknesses are 80 nm. The first etch step may remove as much as 27 nm of silicide. (Previous recipes employed by those skilled in the art, which include significant amounts of $CF_4$ in one-step processes over single layer dielectrics often removed as much as 70 nm or more of silicide. Complete silicide removal was often observed.)

The second etch step, which employs a significant amount of $CF_4$, is employed to completely open both windows, and thus, in particular to open the window $d_2$ without unacceptable degradation of silicide 31. In practice, the second step is frequently carried out for a period of time longer than minimally necessary (i.e., overetching is performed) so that the artisan is confident that all windows on a wafer are opened. Consequently, if the thickness of layer 33 is 200 nm, the etch may be carried out long enough to remove, on the average, 300 nm (typically one minute or so). Under these circumstances, 30 nm of silicide may be removed from both silicide 23 and runner silicide 31, leaving $80-30$ nm$=50$ nm of silicide 25 and $80-27-30=23$ nm runner silicide 31. Both remaining silicide thicknesses have been found acceptable in practice.

The present invention may find applicability in bipolar, BiCMOS, and group III-V integrated circuits.

We claim:

1. A method of fabricating an integrated circuit comprising the steps of:
    forming a raised topographic feature upon a substrate
    forming a first dielectric layer covering said raised topographic feature;
    forming a second dielectric layer covering said first dielectric layer
    characterized by the further steps of planarizing said second dielectric layer;
    selectively etching said second dielectric layer to create at least first and second openings, said first opening being above said topographic feature and said second opening being above said substrate, said etching process stopping in said second opening in the vicinity of said first dielectric; and then etching said first dielectric to extend said second opening to said substrate.

2. A method of fabricating an integrated circuit comprising the steps of:
    forming a transistor including a gate and source/drain regions;
    forming at least one gate runner including a silicide overlayer thereon;
    forming a first dielectric layer covering said source/drain region and said gate runner;
    forming a second dielectric covering said first dielectric layer;
    planarizing said second dielectric layer;
    etching through said second dielectric layer above said gate runner and said source/drain region;
    said etching process not removing all of said silicide overlayer on said gate runner;
    etching through said first dielectric layer to completely open windows to said runner and said source/drain region.

3. The method of claim 1 in which said first dielectric is formed from TEOS.

4. The method of claim 1 in which said second dielectric is formed from BTEOS.

5. The method of claim 1 in which said second dielectric contains boron and phosphorous each in $4\pm\frac{1}{2}\%$ by weight.

6. The method of claim 1 in which said second dielectric is etched employing 30 sccm$\pm 10\%$ of $CHF_3$; 60 sccm$\pm 10\%$ of Ar and 0-3 sccm of $CF_4$ in a plasma.

7. The method of claim 1 in which said first dielectric is etched employing 30 sccm$\pm 10\%$ of $CHF_3$; 60 sccm$\pm 10\%$ of Ar; and 8-12 sccm of $CF_4$ in a plasma.

8. A method of integrated circuit fabrication comprising:
    forming a field oxide upon a substrate, said field oxide defining a moat upon said substrate;
    forming a gate stack upon said substrate within said moat, said gate stack extending over said field oxide as a gate runner;
    forming source and drain region within said substrate in said moat;
    forming a refractory metal silicide upon said source, drain, gate stack and runner;
    forming a layer of TEOS covering said source, drain, gate stack, and runner, the thickness of said TEOS being 200 nm$\pm 10\%$;
    forming a layer of BPTEOS, containing $4\pm\frac{1}{2}\%$ by weight of boron and phosphorous over said TEOS layer, the thickness of said BPTEOS layer being 650 nm;
    planarizing said BPTEOS layer by resist etchback;
    depositing and patterning a photoresist material upon the said planarized BPTEOS, said photoresist having an opening above said runner and above one of said source or drain regions;
    etching said BPTEOS, in a plasma, using said photoresist as a mask using $30\pm 10\%$ sccm of $CHF_3$; 60 sccm$\pm 10\%$ of Ar;
    performing a descum using oxygen in a plasma;
    etching said TEOS in a plasma, using 30 sccm$\pm 10\%$ of $CHF_3$; 60 sccm$\pm 10\%$ of Ar; and 8-12 sccm of $CF_4$.

* * * * *